(12) United States Patent
Tani et al.

(10) Patent No.: US 10,066,316 B2
(45) Date of Patent: Sep. 4, 2018

(54) METHOD FOR PRODUCING SILICON CARBIDE SINGLE-CRYSTAL INGOT AND SILICON CARBIDE SINGLE-CRYSTAL INGOT

(71) Applicant: SHOWA DENKO K.K., Tokyo (JP)

(72) Inventors: Komomo Tani, Tokyo (JP); Takayuki Yano, Tokyo (JP); Tatsuo Fujimoto, Tokyo (JP); Hiroshi Tsuge, Tokyo (JP); Kazuhito Kamei, Tokyo (JP); Kazuhiko Kusunoki, Tokyo (JP); Kazuaki Seki, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 15/551,871

(22) PCT Filed: Feb. 18, 2016

(86) PCT No.: PCT/JP2016/054756
§ 371 (c)(1),
(2) Date: Aug. 17, 2017

(87) PCT Pub. No.: WO2016/133172
PCT Pub. Date: Aug. 25, 2016

(65) Prior Publication Data
US 2018/0066380 A1   Mar. 8, 2018

(30) Foreign Application Priority Data
Feb. 18, 2015   (JP) .................................. 2015-029523

(51) Int. Cl.
*C30B 23/02* (2006.01)
*C30B 23/00* (2006.01)
*C30B 29/36* (2006.01)

(52) U.S. Cl.
CPC ............ *C30B 23/02* (2013.01); *C30B 23/002* (2013.01); *C30B 29/36* (2013.01)

(58) Field of Classification Search
CPC ........ C30B 23/02; C30B 23/002; C30B 29/36
See application file for complete search history.

(56) References Cited

U.S. PATENT DOCUMENTS

2002/0005160 A1* 1/2002 Kitagawa ................ C30B 15/30
117/13
2003/0024468 A1* 2/2003 Altmannshofer ....... C30B 13/26
117/26

(Continued)

FOREIGN PATENT DOCUMENTS

JP   2006-13005 A   1/2006
JP   2008-222509 A   9/2008

(Continued)

OTHER PUBLICATIONS

Gupta et al., "Growth of Large Diameter 6H SI and 4H n+ SiC Single Crystals," Mater. Res. Soc. Symp. Proc., vol. 1246, 1246-B01-01, 2010, 12 pages.

(Continued)

*Primary Examiner* — Robert M Kunemund
(74) *Attorney, Agent, or Firm* — Birch, Stewart, Kolasch & Birch, LLP

(57) ABSTRACT

The present invention provides a method of raising the rate of reduction of the dislocation density accompanying growth of an SiC single crystal to counter the increase in the threading screw dislocations formed near the interface of the seed crystal and grown SiC single crystal and thereby produce an SiC single-crystal ingot with a small threading screw dislocation density from the initial stage of growth. The present invention is a method for producing a silicon carbide single-crystal ingot growing a silicon carbide single crystal on a growth face of a seed crystal consisting of a (Continued)

silicon carbide single crystal by a physical vapor transport method so as to produce a silicon carbide single-crystal ingot, the method for producing a silicon carbide single-crystal ingot comprising forming step bunching with heights of steps of 10 μm to 1 mm and spans of terraces of 200 μm to 1 mm on the growth face of the seed crystal and making the silicon carbide single crystal grow on the growth face of the seed crystal by the physical vapor transport method.

3 Claims, 4 Drawing Sheets

(56) References Cited

U.S. PATENT DOCUMENTS

| | | |
|---|---|---|
| 2005/0230686 A1 | 10/2005 | Kojima et al. |
| 2012/0073495 A1* | 3/2012 | Urakami ............. C30B 23/00 117/106 |
| 2014/0363607 A1 | 12/2014 | Sato et al. |
| 2015/0167197 A1 | 6/2015 | Ujihara et al. |
| 2015/0376813 A1 | 12/2015 | Tsuchida et al. |
| 2017/0037538 A1 | 2/2017 | Masumoto |

FOREIGN PATENT DOCUMENTS

| | | |
|---|---|---|
| JP | 2009-91222 A | 4/2009 |
| JP | 2013-232553 A | 11/2013 |
| JP | 2014-28736 A | 2/2014 |
| JP | 2014-28757 A | 2/2014 |
| JP | 2014-166938 A | 9/2014 |
| WO | WO 2014/034081 A1 | 3/2014 |
| WO | WO 2015/159949 A1 | 10/2015 |

OTHER PUBLICATIONS

International Search Report (Form PCT/ISA/210) for International Application No. PCT/JP2016/054756, dated Apr. 5, 2016, with English translation.

Otani, "Structural Defects in SiC Single Crystal Substrates," Preprints of 17th Meeting of SiC and Related Wide Gap Semiconductors, 2008, p. 8.

Tairov et al., "General Principles of Growing Large-Size Single Crystals of Various Silicon Carbide Polytypes," Journal of Crystal Growth, vol. 52, 1981, pp. 146-150.

Tsuruta, "Prospects of the Practical Use of SiC Power Semiconductor Devices in Automotive Applications," Denso Technical Review, vol. 16, 2011, pp. 90-95, with an English abstract.

Wahab et al., "Influence of Epitaxial Growth and Substrate-Induced Defects on the Breakdown of 4H-SiC Schottky Diodes," Appl. Phys. Lett., vol. 76, No. 19, May 8, 2000, pp. 2725-2727 (4 pages total).

* cited by examiner

METHOD FOR PRODUCING SILICON CARBIDE SINGLE-CRYSTAL INGOT AND SILICON CARBIDE SINGLE-CRYSTAL INGOT

TECHNICAL FIELD

This invention relates to a method for producing a silicon carbide single-crystal ingot growing a silicon carbide single crystal on a seed crystal by a physical vapor transport method and to a silicon carbide single-crystal ingot.

BACKGROUND ART

Silicon carbide (below, referred to as "SiC") is a wide bandgap semiconductor having a 2.2 to 3.3 eV wide bandgap. Due to its excellent physical and chemical properties, it has been the focus of R&D as an environmentally resistant semiconductor material. In particular, in recent years, it has been focused on it as a material for blue to ultraviolet short wavelength devices, high frequency electronic devices, high voltage resistant, high output electronic devices, etc. There has been a boom in R&D in the fabrication of devices by SiC.

For promoting practical application of SiC devices, production of large size SiC single crystals is essential. In most cases, the method of using the physical vapor transport method (Rayleigh method or improved Rayleigh method) to grow a bulk SiC single crystal has been employed (see NPLT 1). That is, an SiC material for sublimation is placed in a crucible, a seed crystal consisting of an SiC single crystal is attached to a lid of the crucible, and the material is made to sublimate to thereby grow an SiC single crystal on the seed crystal by recrystallization. Further, after a substantially columnar shaped SiC bulk single crystal (below, "SiC single-crystal ingot") is obtained, in general the SiC single-crystal ingot is cut into a 300 to 600 µm or so thickness. By this, an SiC single-crystal wafer is produced. The SiC single-crystal wafer is used for fabrication of SiC devices in the electrical and electronic fields etc.

In this regard, an SiC single crystal contains not only hollow hole-shaped defects running in the growth direction called "micropipes", but also dislocation defects, stacking faults, and other crystal defects. These crystal defects cause a drop in the device performance, so their reduction is an important factor in the application of SiC devices. Among these, dislocation defects include threading edge dislocations, basal plane dislocations, and threading screw dislocations. For example, there is a report that in the commercially available SiC single crystal wafers, there are $8\times10^2$ to $3\times10^3$ (/cm$^2$) threading screw dislocations, $5\times10^3$ to $2\times10^4$ (/cm$^2$) threading edge dislocations, and $2\times10^3$ to $2\times10^4$ (/cm$^2$) basal plane dislocations (see NPLT 2).

In recent years, the research and investigation relating to SiC crystal defects and device performance have been advanced very much. The facts that threading screw dislocation defects become the cause of leakage of current in devices, and decrease the lifetime of gate oxide films, etc. have been reported (see NPLTs 3 and 4). To fabricate high performance SiC devices, an SiC single-crystal ingot reduced in threading screw dislocation density has been sought.

Here, there are examples of reports of the behavior of threading screw dislocations in the physical vapor transport method (see NPLT 5). That is, according to NPLT 5, at the interface of a seed crystal consisting of an SiC single crystal and an SiC single crystal grown thereon, at the side of the SiC single crystal grown on the seed crystal (below, referred to as the "grown SiC single crystal"), the threading screw dislocation density increases greatly once compared with the density at the seed crystal side, and then falls along with growth of the SiC single crystal. Because of this reason, as one method of obtaining an SiC single-crystal ingot reduced in threading screw dislocation density, the method for causing this behavior of dislocations at the interface as early as possible is expected to be effective.

CITATION LIST

Patent Literature

PLT 1: Japanese Patent Publication No. 2014-28736A
PLT 2: Japanese Patent Publication No. 2008-222509A
PLT 3: Japanese Patent Publication No. 2009-91222A

Nonpatent Literature

NPLT 1: Yu. M. Tairov and V. F. Tsvetkov, *Journal of Crystal Growth,* vol. 52 (1981) pp. 146 to 150
NPLT 2: N. Otani, *Preprints of 17th Meeting of SiC and Related Wide Gap Semiconductors,* 2008, p. 8
NPLT 3: Q. Wahab et al., *Appl. Phys. Lett* 76 (2000), 2725
NPLT 4: *Denso Technical Review,* Vol. 16 (2011), 90
NPLT 5: A. Gupta et al., *Mater. Res. Soc. Symp. Proc.* 1246 (2010), 1246-B01-01

SUMMARY OF INVENTION

Technical Problem

As explained above, in the production of an SiC single-crystal ingot by the physical vapor transport method, the dislocation density increases at the grown SiC single-crystal side of the interface of the seed crystal and the grown SiC single crystal. After that, the dislocation density tends to decrease along with growth of the SiC single crystal. Until growing to a certain extent of height, a region with a high dislocation density continues to exist.

PLT 1 discloses a method for producing a silicon carbide single crystal structurally converting screw dislocations to stacking faults by a first growth process of growing an at least thickness 0.5 mm silicon carbide single crystal at a first growth atmosphere pressure of 3.9 kPa to 39.9 kPa and a first growth temperature of a temperature of the seed crystal of 2100° C. to less than 2300° C. However, the method of production disclosed in PLT 1 requires further performing a second growth process for mainly growing the SiC single crystal. That is, PLT 1 does not have as its object the improvement of the quality of the SiC single crystal at the initial stage of growth of the SiC single crystal.

The method for producing the single crystal wafer with an SiC epitaxial film disclosed in PLT 2 is characterized by forming an SiC epitaxial film on the SiC single-crystal wafer, then causing step bunching at the surface of the SiC epitaxial film so as to reduce the crystal defects. However, the invention disclosed in PLT 2 has as its technical object the rearrangement of the dislocations present in the epitaxial film to reduce the crystal defects in the epitaxial film. It does not eliminate the crystal defects in the process of growth of the bulk shaped SiC single crystal. The rate of growth of the SiC epitaxial film disclosed in PLT 2 is only about 5 µm/hr. For this reason, it is unclear what extent of effect can be obtained by applying the method of reducing crystal defects disclosed in PLT 2 to a bulk-shaped SiC single crystal formed by the physical vapor transport method at a growth rate of 100 µm/hr or more.

PLT 3 discloses a for producing an SiC single crystal by the solution growth method. Further, PLT 3 has as its object the improvement of the surface of an SiC single-crystal wafer having an off-angle prepared by the physical vapor transport method and discloses a method for forming a layer of an SiC single crystal on that wafer. However, PLT 3 does not disclose forming an SiC single crystal on the seed crystal wafer to a thickness of about 1 mm. For this reason, the method of production disclosed in PLT 3 is insufficient in effect of improvement of the yield in the production of SiC single-crystal wafers. Further, the method of production disclosed in PLT 3 suppresses step bunching and does not proactively utilize step bunching.

The present invention was made in consideration of such a situation and has as its object the provision of a method for raising the ratio by which a threading screw dislocation density near the interface of the seed crystal and grown SiC single crystal can be reduced along with growth of the SiC single crystal and producing an SiC single-crystal ingot with a small threading screw dislocation density from the initial stage of growth of the SiC single crystal.

Solution to Problem

The present inventors engaged in intensive studies on means for obtaining an SiC single-crystal ingot reduced in the effect of increase of threading screw dislocations at the interface of the seed crystal using the physical vapor transport method and the grown SiC single crystal. As a result, the inventors discovered that by using a seed crystal formed with relatively large step bunching at the crystal growth face to grow the SiC single crystal by the physical vapor transport method, it is possible to improve the ratio of reduction of the threading screw dislocation density along with the growth of the SiC single crystal and thereby completed the present invention.

That is, the gist of the present invention is as follows:
(1) A method for producing a silicon carbide single-crystal ingot growing a silicon carbide single crystal on a growth face of a seed crystal consisting of a silicon carbide single crystal by a physical vapor transport method so as to produce a silicon carbide single-crystal ingot, the method for producing a silicon carbide single-crystal ingot comprising forming step bunching with heights of steps of 10 µm to 1 mm and spans of terraces of 200 µm to 1 mm on the growth face of the seed crystal and making the silicon carbide single crystal grow on the growth face of the seed crystal by the physical vapor transport method.
(2) The method for producing a silicon carbide single-crystal ingot according to (1) further comprising forming the step bunching by growing a thickness 0.1 mm to 3 mm silicon carbide single crystal on the growth face of the seed crystal having an off-angle by a solution growth method.
(3) A silicon carbide single crystal ingot comprising a seed crystal of a silicon carbide single crystal having a growth face and a silicon carbide single-crystal region formed on the growth face, step bunching with heights of steps of 10 µm to 1 mm and spans of terraces of 200 µm to 1 mm being formed on the growth face, wherein a threading screw dislocation density is 500/cm$^2$ or less in a crystal region of 60% or more of the height direction of the ingot in the silicon carbide single-crystal region.

Advantageous Effects of Invention

According to the method for producing an SiC single-crystal ingot of the present invention, it is possible to use the physical vapor transport method and obtain an SiC single crystal with a small threading screw dislocation density from the initial stage of growth. For this reason, according to the SiC single-crystal ingot obtained by the present invention, even at the initial stage of growth of the SiC single crystal, it becomes possible to cut out an SiC single-crystal wafer suitable for a device, so it is possible to improve the yield in production of SiC single-crystal wafers. In this way etc., it is extremely useful industrially.

DESCRIPTION OF EMBODIMENTS

Figure 1:
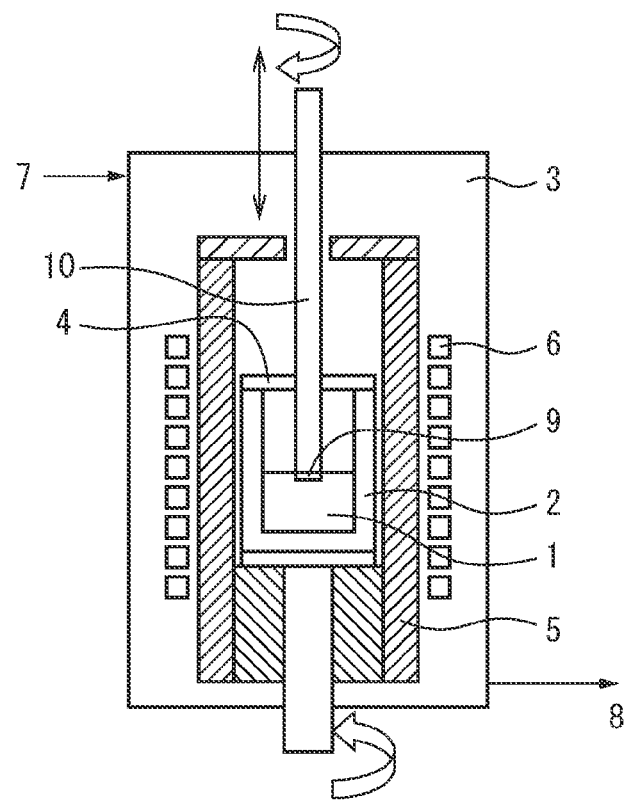
FIG. 1 is a cross-sectional schematic view showing an apparatus for the fabrication of a seed crystal used for the production of an SiC single-crystal ingot of the present invention.

Below, the present invention will be explained in detail. The present invention suppresses the increase in the density of threading screw dislocations formed at the interface part of a seed crystal and grown SiC single crystal when using the physical vapor transport method to grow an SiC single crystal on a seed crystal. That is, in the present invention, the ratio of reduction of the dislocation density is raised along with the growth of the SiC single crystal by the physical vapor transport method so as to obtain an SiC single-crystal ingot with a small dislocation density from the stage of the initial stage of growth.

Usually, the seed crystal face is polished and step bunching is removed. The heights of the steps remaining at the seed crystal face after polishing are 3 µm or less while the spans of the terraces are 100 µm or less. In general, an SiC single crystal was grown on the surface of the seed crystal from which the step bunching was removed in this way. However, as explained first, the present inventors etc. discovered that by growing an SiC single crystal on the crystal growth face of a seed crystal using a seed crystal formed with step bunching on its growth surface in the crystal growth environment of an SiC single crystal by the physical vapor transport method, the threading screw dislocation density is reduced.

Normally, if step bunching is formed at the growth face of a seed crystal, the crystal growth nuclei formed at the terraces of the lower side of the steps of the step bunching will no longer match at the step ends and threading screw dislocations will more easily be formed than when using a general seed crystal not having step bunching. Further, as the step bunching becomes larger, the density of the threading screw dislocations will also become larger. In this regard, however, the greater number of threading screw dislocations formed will be smaller in distances between the dislocations than usual due to their high density and the probability of pair annihilation between positive and negative dislocations will rise. Further, even if the dislocation density falls to a certain extent, dislocations will remain at close distances whereby pair annihilation will easily occur, so, it is believed, the ratio of reduction of the threading screw dislocation density becomes larger along with the growth of the SiC single crystal (below, the ratio of reduction of the threading screw dislocation density along with the growth of the SiC single crystal will be referred to as the "rate of reduction of the dislocation density"). In this way, the present inventors etc. came up with the reverse idea of not suppressing the increase in dislocations at the interface part of the seed crystal and the grown crystal, but rather causing greater formation of dislocations and thereby causing pair annihilation and thereby obtained an SiC single-crystal ingot with a small threading screw dislocation density.

Here, the growth face of the seed crystal used in the present invention is formed with at least one step bunch having a size of heights of steps of 10 μm to 1 mm and spans of the terrace at the bottom side of the steps of 200 μm to 1 mm. When performing the physical vapor transport method, the surfacemost layer of the growth face of the seed crystal starts thermal decomposition in the process of the rise of temperature of the seed crystal, but if the heights of the steps are 10 μm or more and the spans of the terraces are 200 μm or more, step bunching will not disappear until the start of the sublimation and recrystallization of the SiC.

However, if either of the heights of the steps and spans of the terraces of the step bunching exceed 1 mm, normal sublimation-recrystallization growth is inhibited and the polytype becomes unstable. For this reason, the number of step bunches where either of the heights of the steps and spans of the terraces exceeds 1 mm is preferably smaller.

Further, if the heights of the steps of the step bunching are less than 10 μm or the spans of the terraces at the bottom sides of the steps are less than 200 μm, the effect of the present invention of the rate of reduction of the threading screw dislocation density will not become greater.

Figure 6:
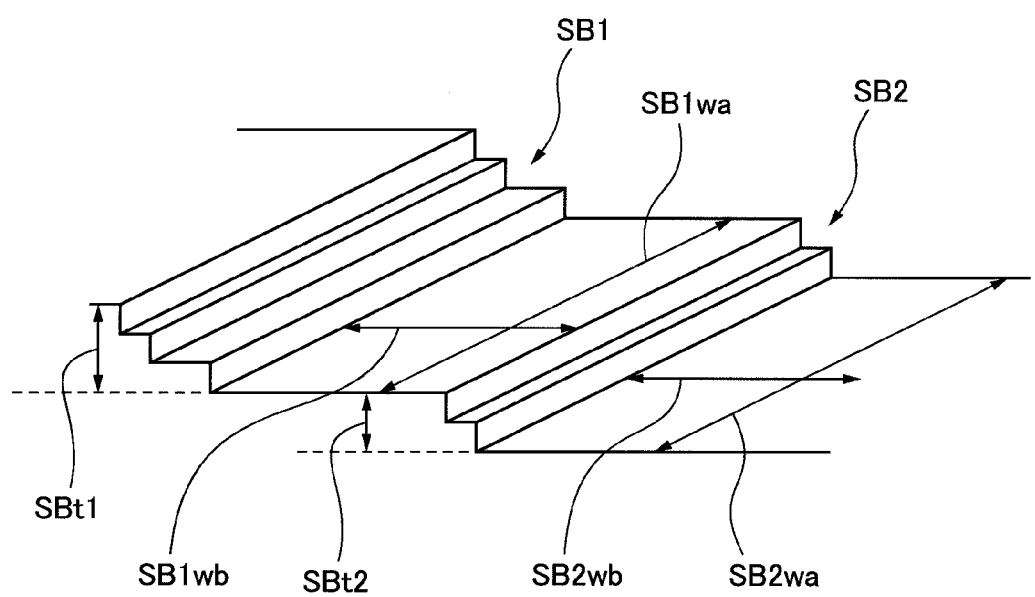
FIG. 6 is an explanatory view schematically showing the state where step bunching is caused on the growth face of the seed crystal.

FIG. 6 is an explanatory view of step bunching. It schematically shows the state where SB1, SB2, and other step bunches are formed on the growth face of a seed crystal. The formed step bunches SB1 and SB2 most preferably have step heights SBt1 and SBt2 of both 10 μm to 1 mm and terrace spans SB1wa, SB1wb, SB2wa, and SB2wb of all 200 μm to 1 mm.

To make the rate of reduction of the threading screw dislocation density at the stage of the initial stage of growth further larger, preferably the heights of the steps of the step bunching are 30 μm or more, more preferably 50 μm or more. Further, the spans of the terraces at the bottom sides of the steps are preferably 400 μm or more, more preferably 600 μm or more.

Further, as the means for forming the step bunching having such sizes on the seed crystal, preferably the solution growth method is used. In the growth of the SiC single crystal by the solution growth method, the crystal growth on the seed crystal having the off-angle becomes relatively unstable compared with crystal growth on the just face with zero off-angle, so if growing the crystal on a seed crystal having an off-angle, it is known that step bunching of a growth height of tens of μm to 100 μm or so will occur. By utilizing this phenomenon, that is, growing the SiC single crystal on the growth face of the seed crystal having the off-angle by the solution growth method before growth of the SiC single crystal by the physical vapor transport method, it is possible to prepare a seed crystal on which the step bunching having the above-mentioned size is formed.

Here, it is possible to increase the thickness of the seed crystal to enlarge the size of step bunching on the growth face of the seed crystal. From the viewpoint of forming the desired size of step bunching, the thickness of the seed crystal for growing the SiC single crystal by the solution growth method is preferably 0.1 mm or more. However, if considering the saturation of the effect, economy, etc., the upper limit of the thickness is 3 mm. On the other hand, regarding the off-angle of the seed crystal, from the viewpoint of efficiently forming step bunching on the crystal surface etc., the off-angle is preferably 0.5 degree to 10 degrees.

Further, regarding the solution growth method, it is possible to use a known method. By immersing a seed crystal having an off-angle in an Si medium in which C is dissolved (Si—C solution) and forming an SiC single crystal, it is possible to form large step bunching as explained above. By arranging a seed crystal on which the step bunching having the above-mentioned size is formed in a single-crystal growth apparatus utilizing the physical vapor transport method and producing an SiC single crystal by a known method, it is possible to obtain the SiC single-crystal ingot of the present invention. Note that, the physical vapor transport method differs from the solution growth method in that no phenomenon of the off-angle of the seed crystal remarkably causing a change in the size of the step bunching can be seen, so it is difficult to use the physical vapor transport method to form large step bunching like with the solution growth method.

According to the present invention, it is possible to obtain an SiC single crystal with a small threading screw dislocation density from the initial stage of growth by the physical vapor transport method. Other than using a seed crystal formed with step bunching of the above-mentioned size, for the physical vapor transport method, a known method may be used.

According to the present invention, it is possible to obtain an SiC single-crystal ingot in which 60% or more of the ingot in the height direction is a high quality crystal region with a threading screw dislocation density of 500/cm$^2$ or less in the initial stage of growth of the SiC single crystal, so it becomes possible to cut out an SiC single-crystal wafer suitable for devices even from the SiC single-crystal ingot in the initial stage of growth and to improve the yield in the production of SiC single-crystal wafers.

EXAMPLES

Below, examples etc. will be used to explain the present invention more specifically. Note that the present invention is not limited to the content of the following examples.

Example 1

FIG. 1 shows an apparatus for preparing a seed crystal used for crystal growth of an SiC single-crystal ingot according to an example of the present invention. This is one example of a single-crystal growth apparatus using the solution growth method. This single-crystal growth apparatus is provided with a graphite crucible 2 in which an Si—C solution 1 is housed. This graphite crucible 2 is arranged inside a water-cooled stainless steel chamber 3. Further, the graphite crucible 2 is substantially sealed by a crucible lid 4 through which a seed shaft 10 passes. The outer circumference of the crucible 2 is insulated by a thermal insulation material 5. Further, a high frequency coil 6 for induction heating is provided at the outer circumference of that. The atmosphere inside the single-crystal growth apparatus is adjusted utilizing a gas introduction port 7 and a gas discharge port 8.

The graphite crucible 2 was charged with Si and Ti as melt materials. Current was run through the high frequency coil 6 for induction heating to melt the materials inside the crucible and form a melt of Si—Ti alloy. Due to dissolution of the container, that is, graphite crucible 2, during heating, carbon melted into the high temperature solution whereby a high temperature SiC solution (Si—C solution) was formed. Further, a diameter 51 mm wafer was cut out from the bulk SiC single-crystal obtained by the physical vapor transport method and polished to a mirror surface to prepare a seed crystal wafer 9 having an off-angle of 4 degrees at the (000-1) face.

This seed crystal wafer 9 was dipped in an Si—C solution 1 50° C. lower than the growth temperature, then was raised in temperature to a growth temperature of 1940° C. and heated for about 1 hour. After reaching the growth temperature, the solution was in an unsaturated state with carbon until carbon is sufficiently supplied to the melt by the dissolution of the crucible. For this reason, the surface layer of the seed crystal wafer 9 dissolves into the solution. In Example 1, the amount of the surface layer of the seed crystal wafer 9 dissolving (dissolved thickness) was about 30 μm. After the carbon in the solution reached saturation, the SiC crystal grew in the solution on the seed crystal wafer 9. The crystal growth time was made 15 hours from immersion of the seed crystal wafer 9 in the solution. During that time, the graphite crucible 2 and the seed shaft 10 were made to rotate in opposite directions by 10 rpm. After growth finished, the seed shaft 10 was made to rise and the seed crystal wafer 9 was separated from the solution 1 to thereby recover the seed crystal.

On the obtained seed crystal, the SiC crystal was newly grown to a thickness of about 500 to 600 μm on the seed crystal wafer 9. The growth face of this seed crystal was observed by a laser microscope. As a result, formation of step bunching of step heights of about 30 μm and terrace spans of about 300 μm was observed.

Figure 2:
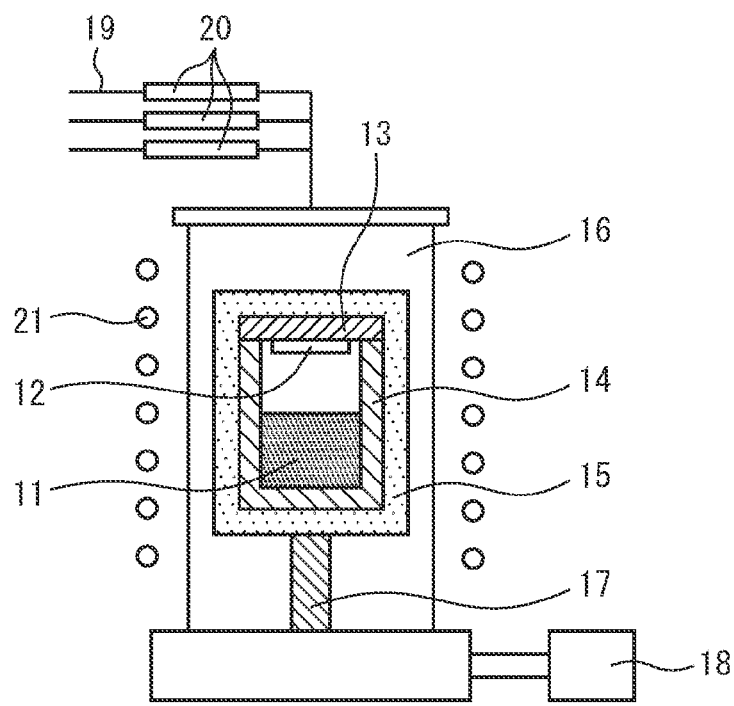
FIG. 2 is a cross-sectional schematic view showing a single-crystal production apparatus for the production of an SiC single-crystal ingot of the present invention.

Further, FIG. 2 shows one example of an apparatus for producing an SiC single-crystal ingot according to an example of the present invention, that is, a single-crystal growth apparatus by the improved Rayleigh method. The crystal was grown by sublimating the SiC material 11 by induction heating and making it recrystallize on the SiC seed crystal 12. The seed crystal 12 on the growth face of which the step bunching was formed by the above solution growth method was attached to the inside surface of the graphite lid 13 of the single-crystal growth apparatus and set in the graphite crucible 14 filled with the SiC material 11. The graphite crucible 14 was covered by graphite felt 15 for shielding it against heat, then was placed on the graphite support rod 17 and set inside the double quartz tube 16.

Further, the inside of the double quartz tube 16 was evacuated by an air discharge device 18, then atmospheric gas consisting of high purity Ar gas and nitrogen gas was introduced through the piping 19 while controlled by a mass flow controller 20 to make the pressure inside the quartz tube (growth atmosphere pressure) 80 kPa at the vacuum evacuation device 18. Under this pressure, current was run through the work coil 21 to raise the temperature. The temperature of the seed crystal 12 was made to rise until 2200° C. After this, the growth atmosphere pressure was reduced to 1.3 kPa over 30 minutes and the crystal was grown for 30 hours so that the (000-1) face of the seed crystal 12 on which the step bunching was formed to become the crystal growth face.

After the above process, a height 9 mm, diameter 51 mm SiC single-crystal ingot was obtained. First, from this ingot, at a position of a growth height of 3 mm expressed by the height from the seed crystal 12, a wafer A for evaluation was cut out in parallel to the seed crystal face (that is, so as to have an off-angle of 4°).

The obtained wafer A for evaluation was immersed for 5 minutes in 520° C. molten KOH so that the entire surface of the wafer was immersed to thereby etch the wafer by molten KOH. The surface of the etched wafer A was observed by an optical microscope (magnification: 80×) to measure the dislocation density. Here, according to the method described in J. Takahashi et al., Journal of Crystal Growth, 135, (1994), 61-70, the dislocations were classified by the etch pit shapes with shell shaped pits being deemed as basal plane dislocations, small sized hexagonal shaped pits being deemed as threading edge dislocations, and medium size and large size hexagonal shaped pits being deemed as threading screw dislocations, respectively, and then their respective dislocation densities were determined. As a result, it was confirmed that the dislocation densities were substantially uniformly distributed in the region of the wafer A minus the 5% ring-shaped region at the inside from the outer circumference by ratio of diameter (region of width 2.55 mm from outer circumference). Note that the same procedure was followed to examine the seed crystal as well, whereupon the dislocation densities were evenly distributed in the face.

Figure 3A:
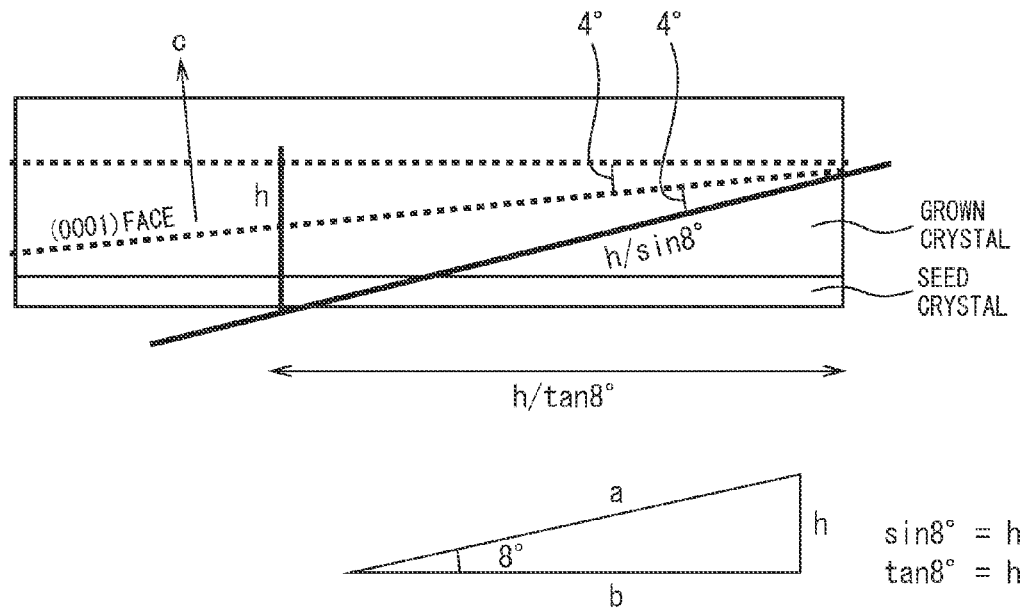
FIGS. 3A and 3B are schematic explanatory views showing the state of cutting out an SiC single crystal wafer to be used for evaluating the threading dislocation densities near the interface of the seed crystal of an SiC single-crystal ingot obtained in an example and comparative example.
Figure 3B:
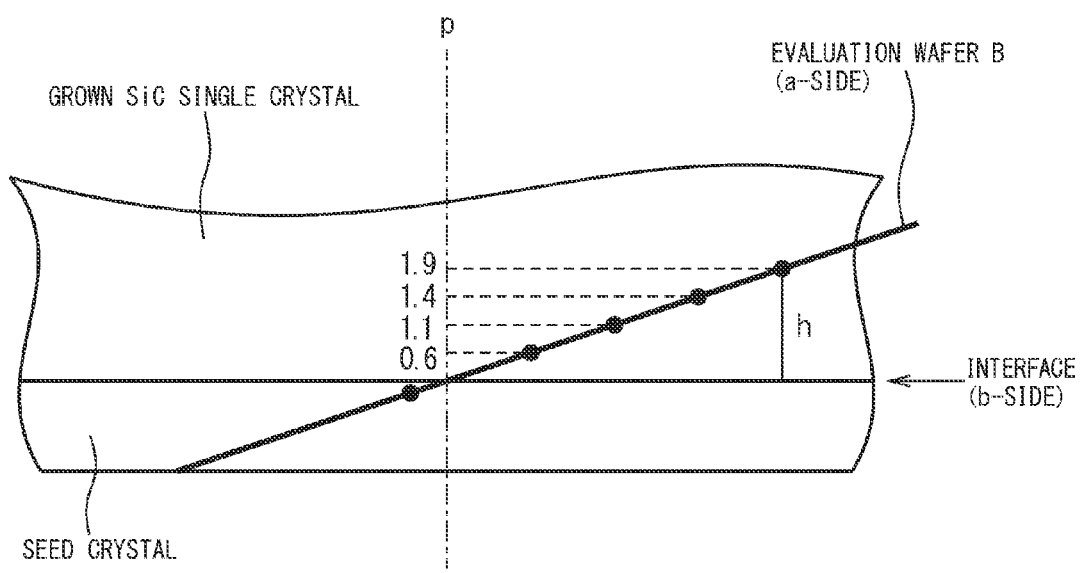

Next, as shown in FIG. 3A, the obtained ingot was cut so that the direction tilted by 4° in a direction opposite to the off direction of the c-axis of the seed crystal 12 became the c-axis of the crystal to obtain an wafer B having an off-angle in a direction opposite to the seed crystal at the (0001) face. At that time, the wafer B was cut out so as to pass through the center of the growth face of the seed crystal. The surface of the wafer B was made to include a seed crystal region and grown SiC single-crystal region. As shown in FIG. 3B, the angle formed by the a-side on the surface of the wafer B and the b-side on the diametrical direction of the seed crystal was 8° whereby an isosceles triangle with a height "h" was formed. By using this cutting method, it became possible to continuously observe changes in the dislocation density accompanying growth. Further, the change in the growth direction was enlarged to substantially 1/sin 8° (about 7×), so it was possible to measure the dislocation density with greater resolution and higher precision.

The obtained wafer B, in the same way as the above wafer A, was immersed for 5 minutes in 520° C. molten KOH so that the entire surface of the wafer was immersed to thereby etch the wafer by molten KOH. While making the surface of the etched wafer follow the changes of the height (h) of the grown SiC single crystal, the measurement points on the a-side)(=h/sin 8° shown in FIG. 3B were observed by an optical microscope (magnification: 80×) to measure the threading dislocation densities. The results are shown in Table 1.

TABLE 1

| Growth height "h" (mm) | Example 1 | | Comparative Example 1 | |
|---|---|---|---|---|
| | Threading screw dislocation density (/cm$^2$) | Threading edge dislocation density (/cm$^2$) | Threading screw dislocation density (/cm$^2$) | Threading edge dislocation density (/cm$^2$) |
| −0.2* | 4.5 × 10$^2$ | 1.8 × 10$^3$ | 4.5 × 10$^2$ | 2.8 × 10$^3$ |
| 0.6 | 2.5 × 10$^4$ | 7.3 × 10$^4$ | 8.3 × 10$^3$ | 6.4 × 10$^4$ |
| 1.1 | 4.1 × 10$^3$ | 2.1 × 10$^4$ | 3.2 × 10$^3$ | 2.8 × 10$^4$ |
| 1.4 | 7.9 × 10$^2$ | 7.7 × 10$^3$ | 2.5 × 10$^3$ | 2.0 × 10$^4$ |
| 1.9 | 1.1 × 10$^2$ | 4.1 × 10$^3$ | 9.0 × 10$^2$ | 5.3 × 10$^3$ |

*In the table, "−0.2 mm" shows the depth from the seed crystal face (interface of seed crystal region and grown SiC single-crystal region) to the inside of the seed crystal region.

Comparative Example 1

In Comparative Example 1, without performing solution growth by an Si—C solution at the crystal growth face of the seed crystal, a diameter 51 mm wafer was cut out from a bulk SiC single crystal obtained by the physical vapor transport method and polished to a mirror surface to prepare a seed crystal wafer having an off-angle of 4 degrees at the (0001) face. This was used as it is for crystal growth of the Si—C single crystal by the physical vapor transport method. That is, other than not performing the solution growth step of the seed crystal, the same procedure was followed as in Example 1 to produce the SiC single-crystal ingot according to Comparative Example 1.

At this time, no step height 10 μm or more or terrace span 200 μm or more step bunching was seen on the crystal growth face of the seed crystal wafer. The obtained SiC single-crystal ingot was cut in the same way as in Example 1 to give an off-angle in the opposite direction to the seed crystal at the (0001) face to obtain the wafer B. This was etched by KOH in the same way as Example 1 and measured for dislocation density by an optical microscope. The results are shown in Table 1.

Figure 4:
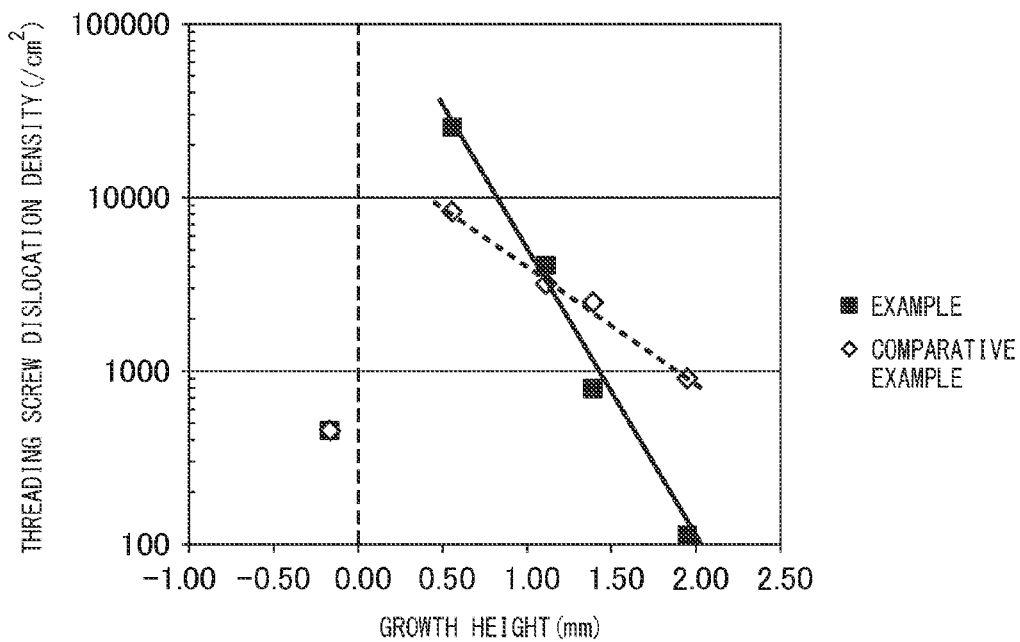
FIG. 4 is a graph showing the state of change of the threading screw dislocation density with respect to the growth height of an SiC single-crystal ingot obtained in an example and comparative example.
Figure 5:
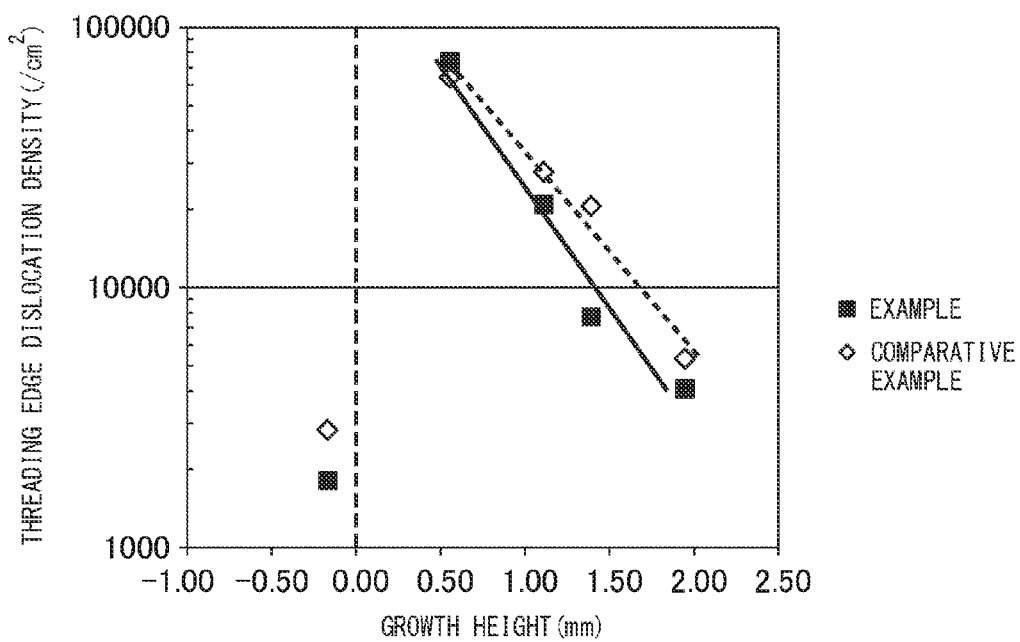
FIG. 5 is a graph showing the state of change of the threading edge dislocation density with respect to the growth height in an SiC single-crystal ingot obtained in an example and comparative example.

Here, the relationship between the growth height (h (mm)) and the value of threading screw dislocation density (/cm$^2$) of the SiC single crystal at the different measurement points on the crystal growth faces of the seed crystal wafers of Example 1 and Comparative Example 1 is shown in FIG. 4. FIG. 5 shows the relationship between the growth height (h (mm)) and the value of threading edge dislocation density (/cm$^2$) of the SiC single crystal for Example 1 and Comparative Example 1. Note that the ordinates of FIG. 4 and FIG. 5 show the log values.

The solid lines and the broken lines drawn in FIG. 4 are respectively curves of primary functions approximating the date of Example 1 and the data of Comparative Example 1. As will be understood from these curves, the slope of the solid line drawn in FIG. 4 is steeper than the slope of the broken line. That is, the rate of reduction of the dislocation density in Example 1 is greater than the rate of reduction of the dislocation density in Comparative Example 1. Further, the SiC single-crystal ingot of Comparative Example 1 produced by the conventional method has a threading screw dislocation density of about 1000/cm$^2$ at a growth height of 1.9 mm, while in the SiC single-crystal ingot of Example 1 produced using the method of production according to the present invention, this is reduced to about 100/cm$^2$.

Further, as will be understood from a comparison of the curve of the solid line in FIG. 5 (corresponding to data of Example 1) and the curve of the broken line (corresponding to data of Comparative Example 1), the method of production according to the present invention does not have any detrimental effect on changes in dislocation density of threading edge dislocations, but increases the rate of reduction of dislocation density of threading edge dislocations. In the initial period of growth near the interface with the seed crystal, in the conventional technologies, the threading dislocation density was high and the result was considered unsuitable for cutting out an SiC single-crystal wafer, while according to the present invention, it becomes possible to cut out an SiC single-crystal wafer having the same as a quality of the seed crystal or better than the quality of the seed crystal from a growth height of about 2 mm.

Further, from the slope of the curve of FIG. 4, it is considered that at a growth height of 1.5 mm or more, a threading screw dislocation density of 500/cm$^2$ or less is achieved. From the fact that the growth height of the ingot according to Example 1 is 9 mm, an SiC single-crystal ingot where a threading screw dislocation density of 500/cm$^2$ or less is about 80% or more of the crystal region in the height direction was obtained.

REFERENCE SIGNS LIST

1. Si—C solution
2. graphite crucible
3. stainless steel chamber
4. crucible lid
5. thermal insulation material
6. high frequency coil
7. gas introduction port
8. gas discharge port
9. seed crystal wafer
10. seed shaft
11. SiC material for sublimation
12. seed crystal
13. graphite lid
14. graphite crucible
15. graphite felt
16. double quartz tube
17. graphite support rod
18. vacuum evacuation device
19. piping
20. mass flow controller
21. work coil

The invention claimed is:

1. A method for producing a silicon carbide single-crystal ingot growing a silicon carbide single crystal on a growth face of a seed crystal consisting of a silicon carbide single crystal by a physical vapor transport method so as to produce a silicon carbide single-crystal ingot,
    the method for producing a silicon carbide single-crystal ingot comprising forming step bunching with heights of steps of 10 μm to 1 mm and spans of terraces of 200 μm to 1 mm on the growth face of the seed crystal and making the silicon carbide single crystal grow on the growth face of the seed crystal by the physical vapor transport method.

2. The method for producing a silicon carbide single-crystal ingot according to claim 1 further comprising forming the step bunching by growing a thickness 0.1 mm to 3 mm silicon carbide single crystal on a growth face of a seed crystal having an off-angle by a solution growth method.

3. A silicon carbide single crystal ingot comprising a seed crystal of a silicon carbide single crystal having a growth face and a silicon carbide single-crystal region formed on the growth face, step bunching with heights of steps of 10 μm to 1 mm and spans of terraces of 200 μm to 1 mm being formed at the growth face,
wherein a threading screw dislocation density is 500/cm$^2$ or less in a crystal region of 60% or more of the height direction of the ingot in the silicon carbide single-crystal region.

* * * * *